United States Patent
Han

(10) Patent No.: US 7,688,644 B2
(45) Date of Patent: Mar. 30, 2010

(54) SEMICONDUCTOR MEMORY DEVICE AND ITS DRIVING METHOD

(75) Inventor: Hi-Hyun Han, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 171 days.

(21) Appl. No.: 11/824,427

(22) Filed: Jun. 29, 2007

(65) Prior Publication Data

US 2008/0056056 A1 Mar. 6, 2008

(30) Foreign Application Priority Data

Aug. 31, 2006 (KR) .................. 10-2006-0083739

(51) Int. Cl.
*G11C 7/00* (2006.01)

(52) U.S. Cl. .............. 365/189.05; 365/203; 365/230.08

(58) Field of Classification Search ................. 365/203, 365/189.05, 230.08
See application file for complete search history.

(56) References Cited

U.S. PATENT DOCUMENTS

| 6,081,468 A * | 6/2000 | Taira et al. ................. 365/203 |
| 6,141,276 A * | 10/2000 | Mullarkey et al. .......... 365/203 |
| 6,208,563 B1 * | 3/2001 | Naritake ................. 365/189.05 |
| 6,240,035 B1 * | 5/2001 | Noda et al. ................. 365/226 |

FOREIGN PATENT DOCUMENTS

KR     2001-0084291     9/2001

\* cited by examiner

*Primary Examiner*—Son Dinh
(74) *Attorney, Agent, or Firm*—Blakely, Sokoloff, Taylor & Zafman LLP

(57) ABSTRACT

A semiconductor memory device includes an address latch unit, a decoding circuit, and a precharge control unit. The address latch unit provides a latched address during an active operation interval and a precharge operation interval. The decoding circuit decodes an output of the address latch unit to provide a decoded signal to activate a word line arranged in a data storage area. The precharge control unit controls the decoded signal to be disabled during the precharge operation interval.

15 Claims, 6 Drawing Sheets

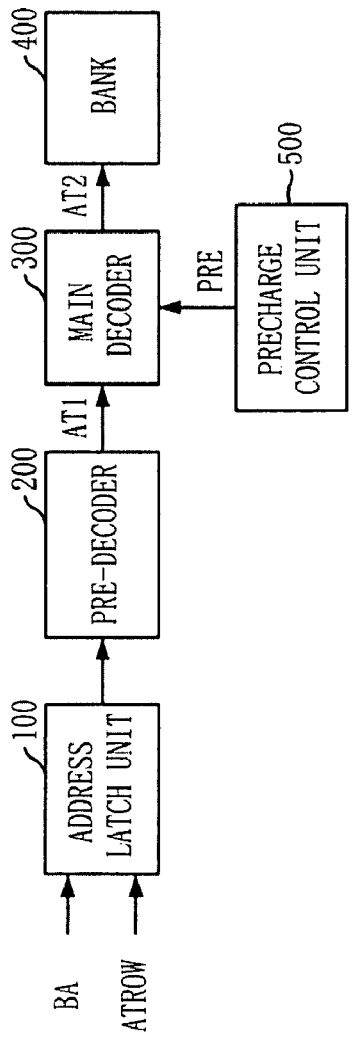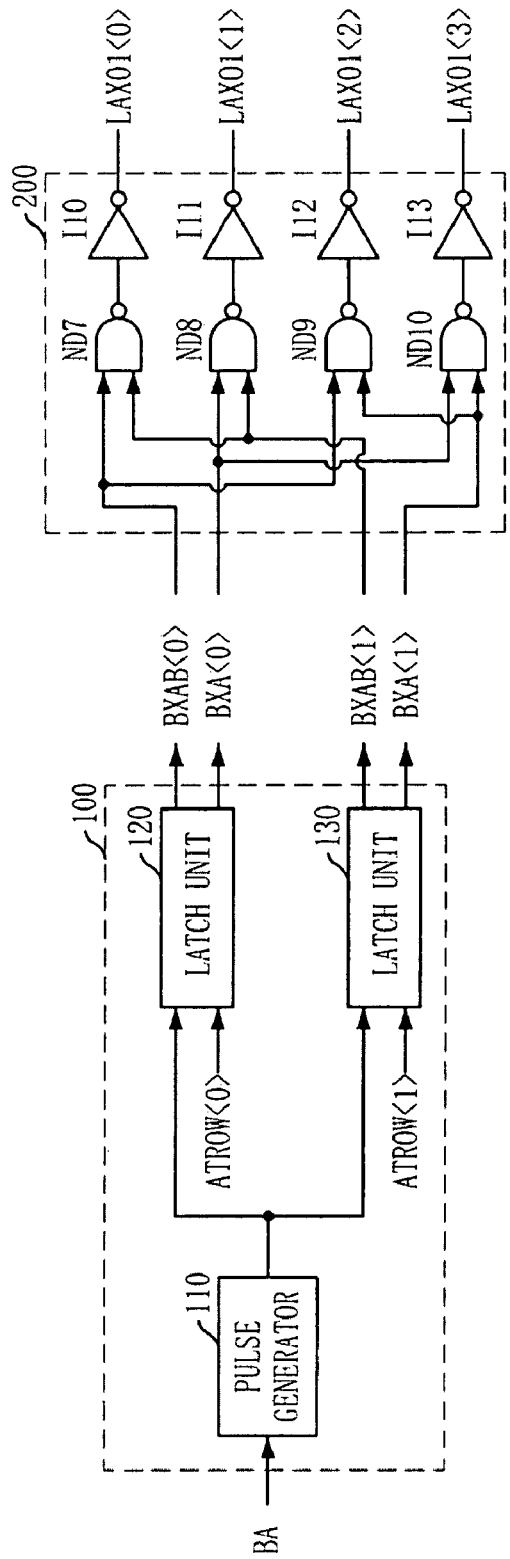

SEMICONDUCTOR MEMORY DEVICE AND ITS DRIVING METHOD

CROSS-REFERENCE TO RELATED APPLICATION

The present invention claims priority of Korean patent application number 10-2006-0083739, filed on Aug. 31, 2006, which is incorporated by reference in its entirety.

BACKGROUND OF THE INVENTION

The present invention relates to a semiconductor memory device; and, more particularly, to a decoder circuit for use in the semiconductor memory device.

As well-known in the art, a semiconductor memory device is a semiconductor device for storing data and outputting the stored data. The semiconductor memory device includes a data storage area in which a plurality of unit cells are disposed for storing data and an input/output area in which a data input/output circuit for outputting the data stored in the data storage area or delivering data from outside to the data storage area is arranged.

The input/output area is provided with a data input circuit, a data output circuit, an address input circuit, and a command input circuit. The data input circuit serves to convey data provided from outside to the data storage area in response to a write command, and the data output circuit is for outputting data from the data storage area to the outside in response to a read command. Further, the address input circuit is to accept an address to designate a position of data to be stored or outputted and output it in response to the write command and the read command. And, the command input circuit functions to control other circuits including the above circuits by analyzing the read command or write command, and the like applied thereto.

Meanwhile, the data storage area is provided with a plurality of banks, each having a plurality of unit cells corresponding to their respective addresses. In general, one bank has a multiplicity of cell blocks into which plural unit cells are grouped. In addition, the data storage area is provided with a decoding circuit which receives and decodes an address from the input/output area and selects a unit cell corresponding to the received address among the unit cells prepared in each bank.

For efficient decoding of a received address, the semiconductor memory device includes a pre-decoder and a main decoder. When an address is inputted, the pre-decoder decodes the inputted address once and thereafter the main decoder decodes an address signal decoded by the pre-decoder once again. The pre-decoder and main decoder are provided in each bank of the semiconductor memory device. Because the semiconductor memory device is provided with these decoders in each bank, it can perform a data access operation for each bank.

In the data access procedure of the semiconductor memory device, an address is first inputted. Then, a bank corresponding to the inputted address is selected and the inputted address is decoded by a pre-decoder prepared in the selected bank. Next, an output of the pre-decoder is decoded once more by a main decoder and data corresponding to the decoded result is accessed. Once the data has been accessed, a precharge operation is carried out. The precharge operation refers to an operation in which various circuits including the main decoder and the pre-decoder are reset to a precharge value for the next data access.

With the advance of technology, it is required that the semiconductor memory device consumes less power and accesses data more rapidly. There has been too much current consumption during the operation of the main decoder and the pre-decoder for data access. Therefore, a need has existed for a development of a scheme for reducing the current consumption.

SUMMARY OF THE INVENTION

Embodiments of the present invention are directed to provide a semiconductor memory device for reducing a current consumption by appropriately controlling operations of a main decoder and a pre decoder.

In accordance with an aspect of the present invention, there is provided a semiconductor memory device including an address latch unit, a decoding circuit, and a precharge control unit. The address latch unit provides a latched address during an active operation interval and a precharge operation interval. The decoding circuit decodes an output of the address latch unit to provide a decoded signal to activate a word line arranged in a data storage area. The precharge control unit controls the decoded signal to be disabled during the precharge operation interval.

In accordance with another aspect of the present invention, there is provided a semiconductor memory device including an address latch unit, an output maintaining unit, a decoding circuit, and a precharge control circuit. The address latch unit latches an address signal in response to an active signal being activated correspondingly to an active operation. The output maintaining unit maintains an output of the address latch unit for an active operation interval in which the active operation is done and a precharge operation interval. The decoding circuit decodes an output signal of the output maintaining unit to activate a word line provided in a data storage area. The precharge control circuit controls a signal outputted from the decoding circuit to activate the word line to be disabled during the precharge operation interval.

In accordance with further another aspect of the present invention, there is provided a driving method of a semiconductor memory device. The driving method includes latching an address to provide a latched address; decoding the latched address to enable a word line; and disabling the enabled word line during a precharge interval. The latched address is continuously outputted and maintained during an active operation interval and a precharge operation interval.

BRIEF DESCRIPTION OF THE DRAWINGS

FIG. 5 illustrates a block diagram of a semiconductor memory device in accordance with an embodiment of the present invention.

FIG. 6 offers a circuit diagram of the address latch circuit and the pre-decoder depicted in FIG. 5.

DESCRIPTION OF SPECIFIC EMBODIMENTS

Hereinafter, preferred embodiments of the present invention will be set forth in detail with reference to the accompanying drawings to a degree so that a person skilled in the art can easily carry out the invention.

Figure 1:
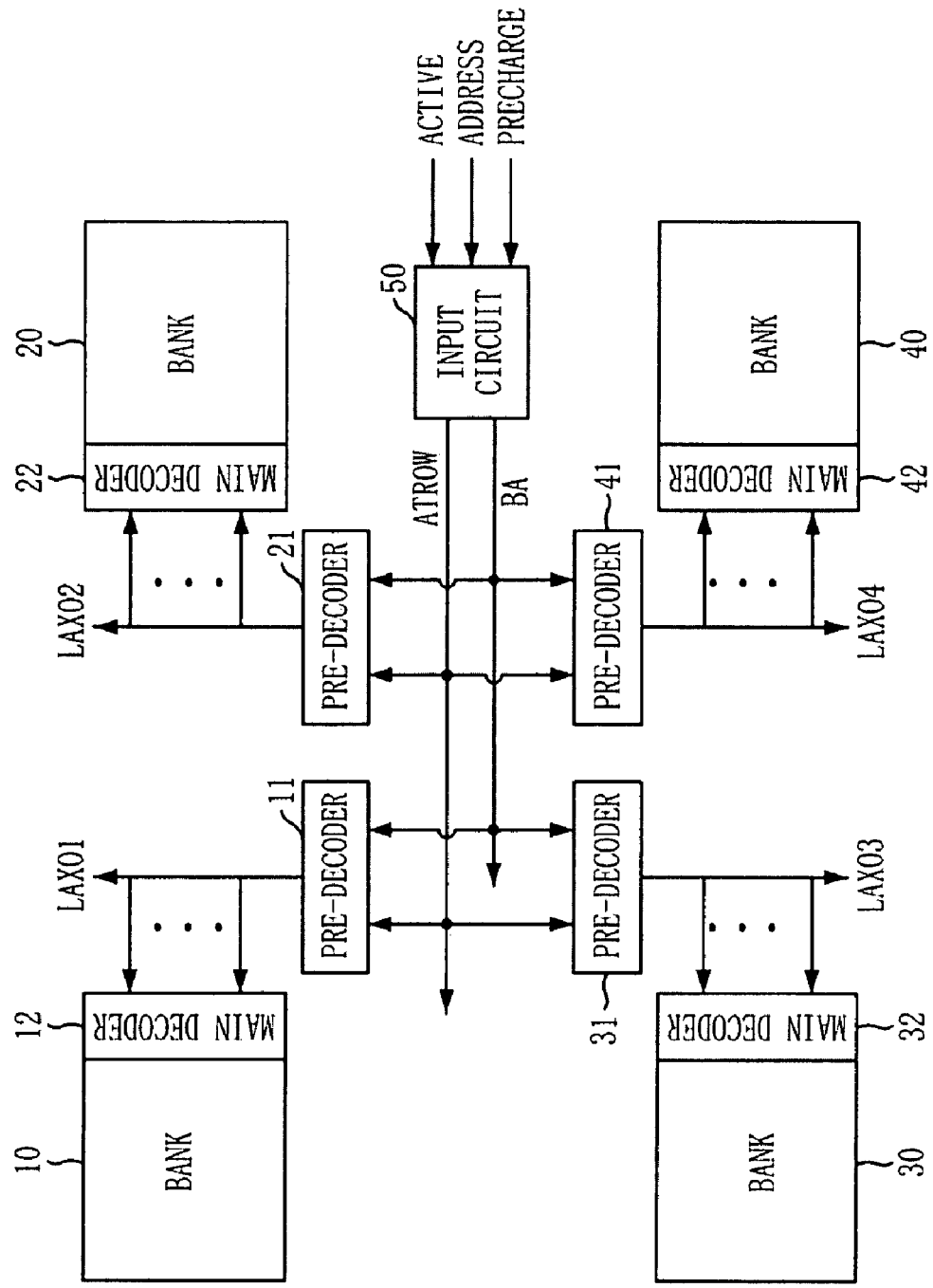
FIG. 1 shows a block diagram of a semiconductor memory device.

FIG. 1 shows a block diagram of a semiconductor memory device.

Referring to FIG. 1, the semiconductor memory device is provided with a plurality of banks 10, 20, 30 and 40, pre-decoders 11, 21, 31 and 41, main decoders 12, 22, 32 and 42, and an input circuit 50. Each of the banks 10, 20, 30 and 40 has a multiplicity of word lines, each corresponding to a plurality of unit cells. Further, each bank corresponds to each of the pre-decoders and each of the main decoders. The input circuit 50 receives a control signal ACTIVE, an address ADDRESS, and a precharge signal PRECHARGE, and then delivers them to the corresponding pre-decoder. The pre-decoder accepts and decodes an internal address and outputs a decoded address in response to an active signal BA provided from the input circuit 50. The corresponding main decoder decodes the address signal from the pre-decoder and then activates a word line prepared in the corresponding bank.

The active signal BA represents a signal being activated during an active operation interval in response to an active command. Here, the active operation interval refers to an interval from input and decoding of an address and selection of a word line in a bank to sensing and amplification of a data signal of a unit cell corresponding to the selected word line. After the data signal stored in the unit cell has been sensed and amplified, a data signal corresponding to a read or write command is accessed. Upon completion of the data access, the interval becomes a precharge interval in response to a precharge command. The precharge interval denotes an interval for preparation of execution of the next active command or read/write command.

Figure 2:
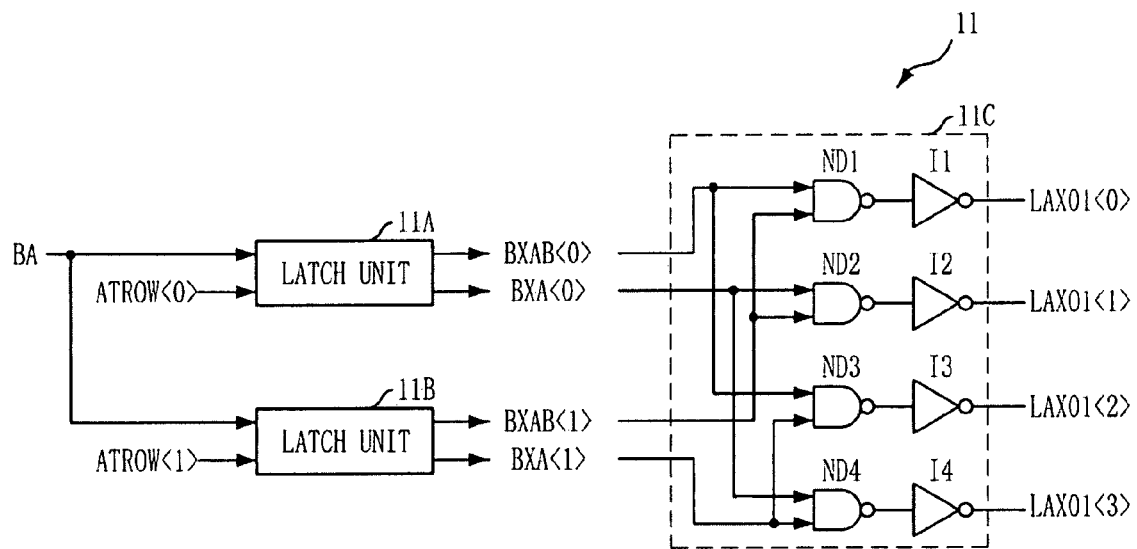
FIG. 2 provides an inside block diagram of the pre-decoder depicted in FIG. 1.

FIG. 2 provides an inside block diagram of the pre-decoder depicted in FIG. 1.

Referring to FIG. 2, the pre-decoder 11 is provided with latch units 11A and 11B, and a decoder 11C. Each of the latch units 11A and 11B latches a corresponding internal address ATROW<0> or ATROW<1> in response to the active signal BA. The decoder 11C decodes latched address signals BXAB<0>, BXA<0>, BXAB<1> and BXA<1> from the latch units 11A and 11B, and then decoded signals to the corresponding main decoder. To do so, the decoder 11C is provided with NAND gates ND1 to ND4 and inverters I1 to I4. For instance, when the latch unit 11A latches an internal address and outputs a latched address, the decoder 11C decodes and outputs this. A decoded signal from the decoder 11C is forwarded to the corresponding main decoder.

Figure 3:
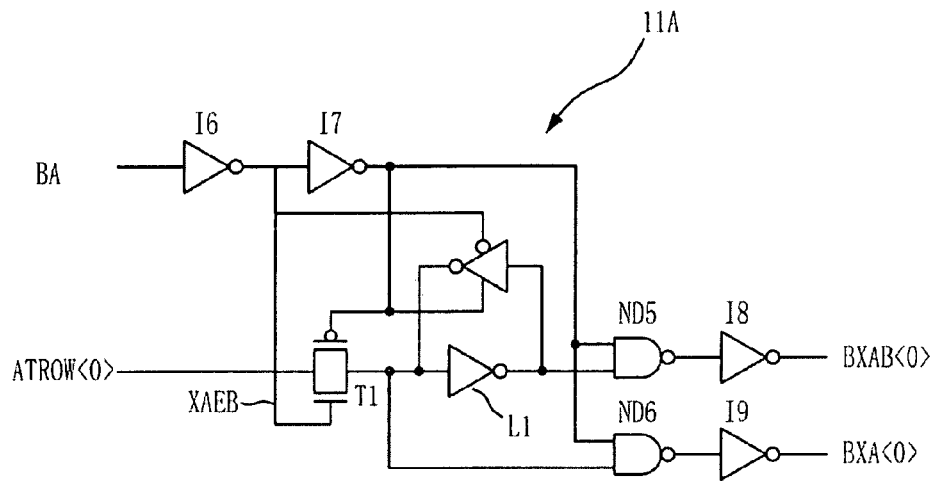
FIG. 3 presents a circuit diagram of the latch circuit shown in FIG. 2.

FIG. 3 presents a circuit diagram of the latch unit shown in FIG. 2.

Referring to FIG. 3, the latch unit 11A is provided with inverters I6 and I7 for inverting an active signal BA, a transmission gate T1 for transmitting an address ATROW<0> in response to outputs of the inverters I6 and I7, a latch circuit L1 for latching an output of the transmission gate T1, a NAND gate ND5 and an inverter I8 for logically combining an output of the inverter I7 and an output of the latch circuit L1, and a NAND gate ND6 and an inverter I9 for logically combining an output of the transmission gate T1 and an output of the inverter I7.

Figure 4:
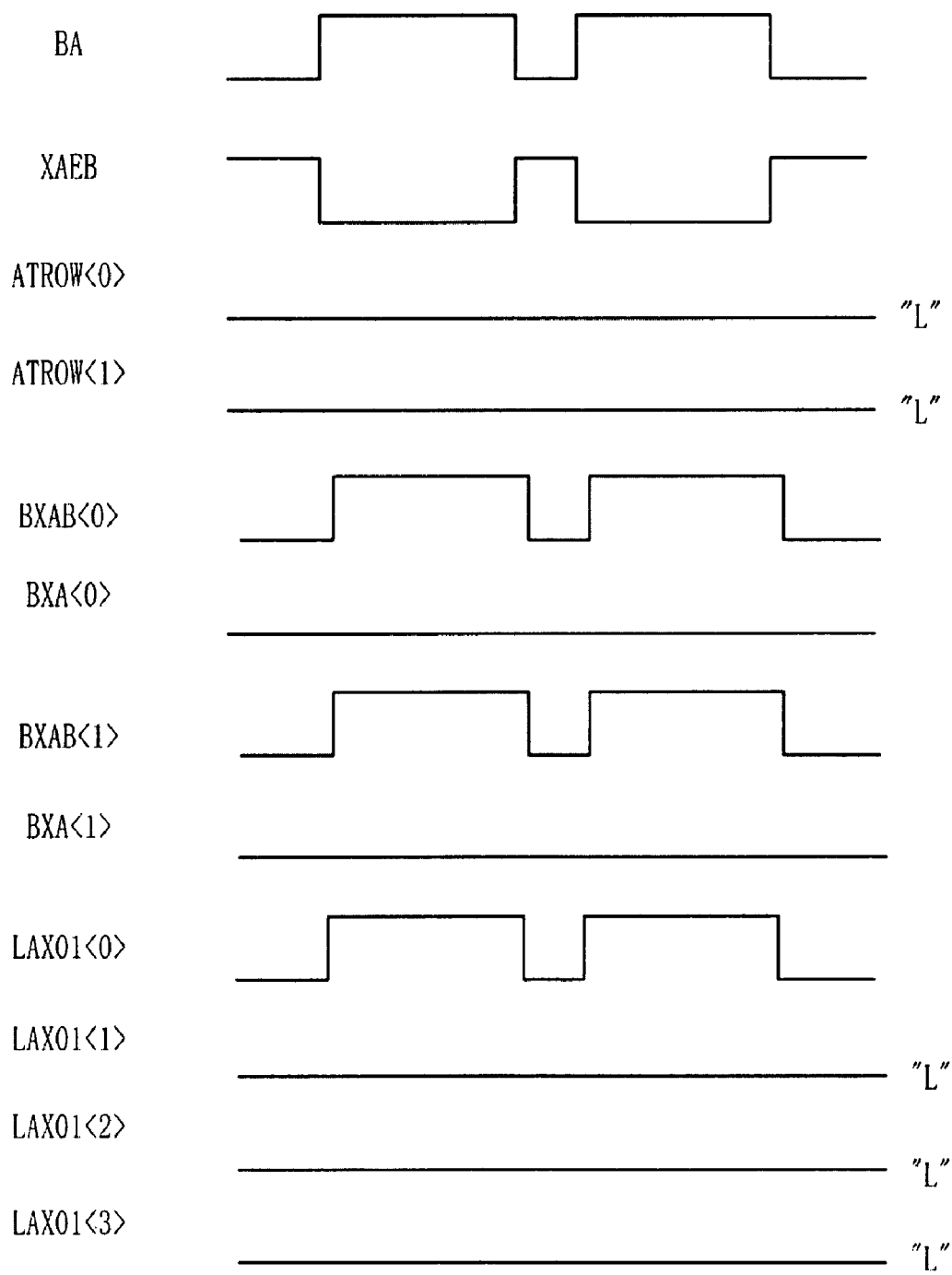
FIG. 4 is a waveform diagram representing the operation of the pre-decoder shown in FIG. 2.

FIG. 4 is a waveform diagram representing the operation of the pre-decoder shown in FIG. 2.

During the active interval, when the active signal BA is activated to a high level, the interval addresses ATROW<0> and ATROW<1> of a low level are latched by the latch units 11A and 11B. The latch units 11A and 11B latch the internal addresses ATROW<0> and ATROW<1> and then output them as signals BXAB<0>, BXA<0>, BXAB<1> and BXA<1>. Here, the signals BXAB<0> and BXA<0> have complimentary phases, and the signals BXAB<1> and BXA<1> also have complimentary phases when the active signal BA is activated. The decoder 11C decodes the signals BXAB<0>, BXA<0>, BXAB<1> and BXA<1>, and then outputs a signal LAX01<0> at a high level and the other signals LAX01<1>, LAX01<2> and LAX01<3> at a low level. The main decoder decodes the outputs of the decoder 11C and activates a word line of the corresponding bank.

Meanwhile, during the precharge interval, when the active signal BA is inactivated to a low level, the latch units 11A and 11B disable the output signals to a low level regardless of the internal address ATROW. Therefore, the signals outputted from the decoder 11C all become disabled at a low level, and thus, all the signals from the main decoder also become disabled.

However, during the precharge interval, although the outputs of the latch units are not disabled to the low level, all the signals from the main decoder need be disabled. In other words, a control unit controlling the precharge operation must control the main decoder not to activate any of word lines in the corresponding bank. Thus, since the output of the main decoder is already disabled during the precharge interval, the outputs of the latch units and the decoder do not need to be disabled. In the transition procedure of disabling the outputs of the latch units and the decoder, there may be occurrence of an unnecessary current consumption.

FIG. 5 illustrates a block diagram of a semiconductor memory device in accordance with a preferred embodiment of the present invention.

With reference to FIG. 5, the semiconductor memory device of the present invention includes an address latch unit 100, a pre-decoder 200, a main decoder 300, a bank 400, and a precharge control unit 500. The address latch unit 100 latches an address signal ATROW in response to an active signal BA being activated correspondingly to an active operation, and then outputs it for an active operation interval in which an active operation is done and a precharge operation interval. The pre-decoder 200 decodes an address signal outputted from the address latch unit 100. The main decoder 300 decodes a signal from the pre-decoder 200 and activates a word line provided in the bank 400. The precharge control unit 500 disables a signal outputted from the main decoder 300 used to activate the word line.

FIG. 6 offers a circuit diagram of the address latch unit and the pre-decoder depicted in FIG. 5.

Referring to FIG. 6, the address latch unit 100 is provided with a pulse generator 110 and latch units 120 and 130. The pulse generator 110 converts an active signal BA into a corresponding pulse signal and provides it to the latch units 120 and 130. The latch units 120 and 130 latch internal address signals ATROW<0> and ATROW<1> in response to the active signal BA being activated correspondingly to the active operation, respectively.

The pre-decoder 200 is provided with NAND gates ND7 to ND10 and inverters I10 to I13 for decoding signals BXAB<0>, BXA<0>, BXAB<1>, BXA<1> outputted form the latch units 120 and 130.

Figure 7:
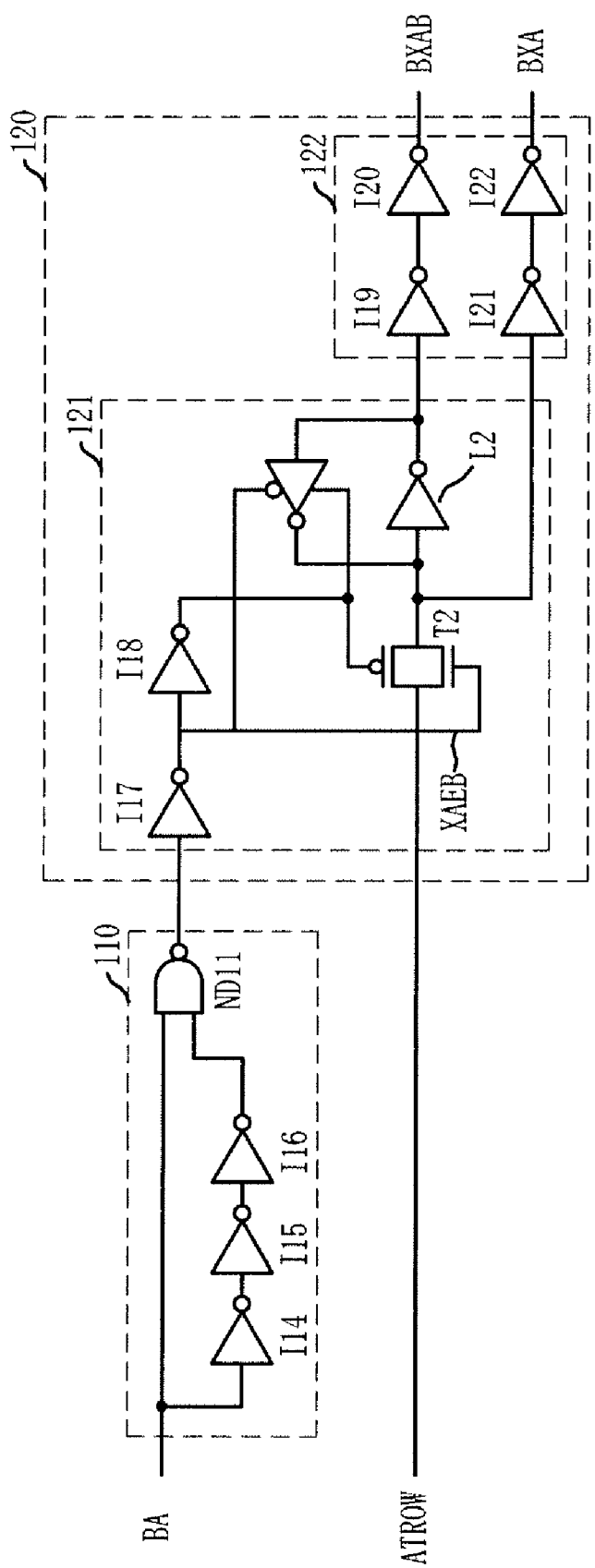
FIG. 7 illustrates a detailed circuit diagram of the address latch circuit depicted in FIG. 6.

FIG. 7 illustrates a circuit diagram of the address latch unit depicted in FIG. 6, especially of an inside circuit of the pulse generator and the latch units included in the address latch unit.

As shown in FIG. 7, the pulse generator 110 is provided with inverters I14 to I16 for inverting an active signal BA, and a NAND gate ND11 taking an output of the inverter I16 and the active signal BA. One of the latch units, 120, is provided with a latch block 121 and an output circuit 122. The latch block 121 is constituted by a transmission gate T2 for transmitting the address signal ATROW<0> in response to an output of the NAND gate ND11 and a latch circuit L2 for latching an output of the transmission gate T2 in response to the output of the NAND gate ND11. The output circuit 122 is composed of inverters I19 and I20, and I21 and I22 coupled in series respectively, for buffering signals outputted from the latch circuit L2 and the transmission gate T2. Although there is shown only the latch unit 120 receiving the address signal ATROW<0>, the latch unit 130 receiving the address signal ATROW<1> may also be made in the same structure as the latch unit 120.

Figure 8:
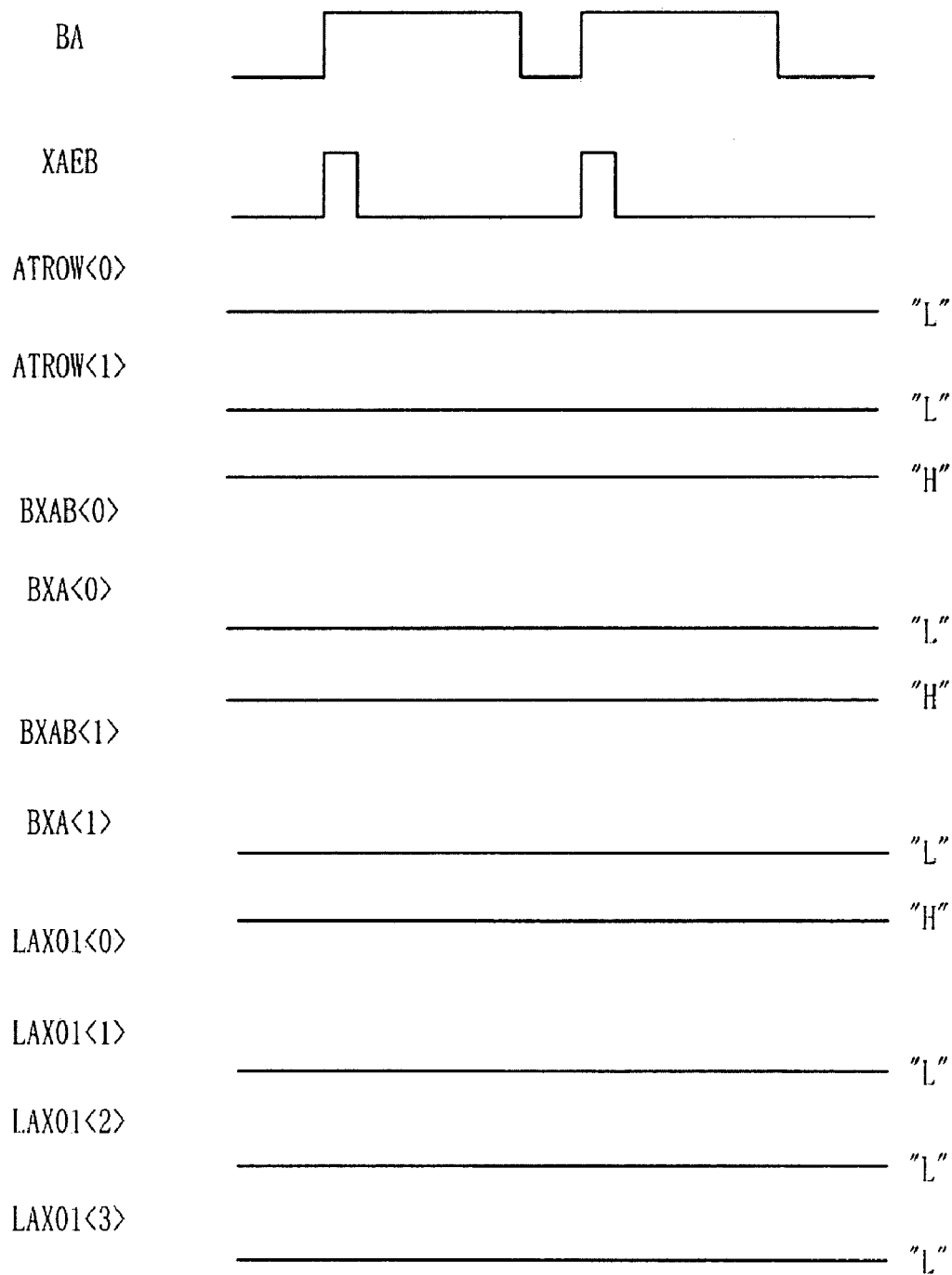
FIG. 8 is a waveform diagram describing the operation of the pre-decoder depicted in FIG. 5.

FIG. 8 presents a waveform diagram describing the operation of the pre-decoder depicted in FIG. 5.

During the active interval, when the active signal BA is activated to a high level, the pulse generator 110 generates a pulse corresponding to a transition of the active signal BA to a high level and provides it to each of the latch units 120 and 130. The latch units 120 and 130 latch interval addresses ATROW<0> and ATROW<1> in response to the pulse signal from the pulse generator 110. For example, the latch circuit 120 latches the internal address ATROW<0> and outputs signals BXAB<0> and BXA<0>. Here, the signals BXAB<0> and BXA<0> have opposite phases. The pre-decoder 200 decodes the signals BXAB<0>, BXA<0>, BXAB<1> and BXA<1>, and then provides a signal LAX01 as a high level and other signals LAX01<1>, LAX01<2> and LAX01<3> as a low level. The main decoder 300 decodes the outputs of the pre-decoder 200 and activates a word line of the corresponding bank.

Meanwhile, during the precharge interval, although the active signal BA is inactivated to a low level, the signal from the latch unit 120 is continuously maintained to be a previously outputted signal. Especially, the output circuit 122 of the latch unit 120 is composed of buffers for simply buffering the signals from the latch unit and outputting them, without the control of the active signal. Since the signals from the latch unit 120 are continuously maintained during the precharge interval, the pre-decoder continuously receives the activated signals. Therefore, the signals outputted from the latch unit are not transited even after the active operation interval has expired and the precharge interval has arrived, thereby reducing current consumption.

On the other hand, the precharge control unit 500 outputs a control signal PPE to the main decoder 300 so that it does no longer outputs a signal to activate a word line.

As described above, since the semiconductor memory device of the present invention is operated in a manner that the latch unit receiving and latching an address continuously maintains its output during the active operation interval and the precharge operation interval, it can reduce current consumption, compared with a case where a transition of the internal address signal occurs for every precharge interval. Although the signal is outputted from the latch unit during the active operation interval and the precharge operation interval, the main decoder which accepts and decodes the output of the latch unit is under the control of the precharge control unit, thereby causing no internal error during the precharge interval.

As a result, the present invention can reduce current which is unnecessarily consumed in the procedure of receiving and decoding an address. Accordingly, the present invention can easily manufacture semiconductor memory devices with reduced power consumption.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   an address latch unit for providing a latched address during an active operation interval and a precharge operation interval;
   a decoding circuit for decoding an output of the address latch unit to provide a decoded signal to activate a word line arranged in a data storage area; and
   a precharge control unit for controlling the decoded signal to be disabled during the precharge operation interval,
   wherein the address latch unit includes:
   a latch unit for latching an address signal in response to an active signal being activated correspondingly to an active operation; and
   an output circuit for buffering an output of the latch unit.

2. The semiconductor memory device as recited in claim 1, wherein the address latch unit further includes a pulse generator for converting the active signal into a corresponding pulse signal to provide the pulse signal to the latch unit.

3. The semiconductor memory device as recited in claim 2, wherein the pulse generator includes:
   an inverter for inverting the active signal; and
   a NAND gate receiving an output of the inverter and the active signal.

4. The semiconductor memory device as recited in claim 3, wherein the latch unit in the address latch unit includes:
   a transmission gate for transmitting the address signal in response to an output of the NAND gate; and
   a latch circuit for latching an output of the transmission gate in response to an output of the NAND gate.

5. The semiconductor memory device as recited in claim 4, wherein the output circuit in the address latch unit includes a buffer for buffering a signal from the latch circuit.

6. The semiconductor memory device as recited in claim 1, wherein the decoding circuit includes:
   a pre-decoder for decoding an output of the address latch unit; and
   a main decoder for decoding an output of the pre-decoder to provide the decoded signal.

7. A semiconductor memory device comprising:
   an address latch unit for latching an address signal in response to an active signal being activated correspondingly to an active operation;
   an output maintaining unit for maintaining an output of the address latch unit for an active operation interval in which the active operation is performed during a precharge operation interval;
   a decoding circuit for decoding an output signal of the output maintaining unit to activate a word line provided in a data storage area; and
   a precharge control circuit for controlling a signal outputted from the decoding circuit to activate the word line to be disabled during the precharge operation interval.

8. The semiconductor memory device as recited in claim 7, wherein the address latch unit further includes a pulse generator for converting the active signal into a corresponding pulse signal to provide the pulse signal to the address latch unit.

9. The semiconductor memory device as recited in claim 8, wherein the pulse generator includes:
   an inverter for inverting the active signal; and
   a NAND gate for receiving an output of the inverter and the active signal.

10. The semiconductor memory device as recited in claim 9, wherein the address latch unit includes:
   a transmission gate for transmitting the address signal in response to an output of the NAND gate; and
   a latch circuit for latching an output of the transmission gate in response to an output of the NAND gate.

11. The semiconductor memory device as recited in claim 10, wherein the output maintaining unit includes a buffer for buffering a signal from the latch circuit.

12. The semiconductor memory device as recited in claim 11, wherein the decoding circuit includes:
   a pre-decoder for decoding an output of the address latch unit; and
   a main decoder for decoding an output of the pre-decoder to provide the decoded signal.

13. A driving method of a semiconductor memory device, comprising:
   latching an address to provide a latched address;
   decoding the latched address to enable a word line; and
   disabling the enabled word line during a precharge interval,
   wherein the latched address is continuously outputted and maintained during an active operation interval and a precharge operation interval.

14. The driving method as recited in claim 13, wherein said decoding the latched address includes:
   pre-decoding the latched address to output a pre-decoded address; and
   decoding the pre-decoded address.

15. The driving method as recited in claim 13, wherein said latching the address includes:
   receiving a command signal;
   converting the received command signal into a corresponding pulse signal; and
   latching the address by using the pulse signal.

* * * * *